United States Patent
Wasilousky et al.

(10) Patent No.: US 11,454,837 B2
(45) Date of Patent: Sep. 27, 2022

(54) AOM SYSTEM WITH INTERFACE BOARD AND SIGNAL VIAS AND RELATED METHODS

(71) Applicant: Eagle Technology, LLC, Melbourne, FL (US)

(72) Inventors: Peter A. Wasilousky, Indialantic, FL (US); John Erhinyo, Jacksonville, FL (US); Michael R. Lange, Melbourne, FL (US); Catheryn D. Logan, Melbourne, FL (US); Randall K. Morse, Palm Bay, FL (US); Christopher A. Corey, Palm Bay, FL (US)

(73) Assignee: EAGLE TECHNOLOGY, LLC, Melbourne, FL (US)

( * ) Notice: Subject to any disclaimer, the term of this patent is extended or adjusted under 35 U.S.C. 154(b) by 432 days.

(21) Appl. No.: 16/691,709

(22) Filed: Nov. 22, 2019

(65) Prior Publication Data
US 2021/0157175 A1    May 27, 2021

(51) Int. Cl.
*H05K 1/11*    (2006.01)
*G02F 1/11*    (2006.01)
*H05K 3/40*    (2006.01)

(52) U.S. Cl.
CPC ............. *G02F 1/113* (2013.01); *H05K 1/115* (2013.01); *H05K 3/4038* (2013.01);
(Continued)

(58) Field of Classification Search
CPC ............. H05K 1/115; H05K 2201/096; H05K 2201/09609; H05K 2201/10378;
(Continued)

(56) References Cited

U.S. PATENT DOCUMENTS 4,256,362 A     3/1981  Bardos
5,367,216 A *  11/1994  Egara ................. H03H 9/02866
                                                          333/194
(Continued)

FOREIGN PATENT DOCUMENTS

EP    0988575      3/2000
JP    h02248923    10/1990

OTHER PUBLICATIONS

Wasilousky et al. U.S. Appl. No. 16/690,522, filed Nov. 21, 2019.
(Continued)

*Primary Examiner* — Hoa C Nguyen
(74) *Attorney, Agent, or Firm* — Allen, Dyer, Doppelt + Gilchrist, P.A.

(57) ABSTRACT

A system may include a laser source, and an AOM coupled to the laser source. The AOM may include an acousto-optic medium, and transducer electrodes carried by the acousto-optic medium. The system may also include an interface board having a dielectric layer, and vertically extending signal vias within the dielectric layer. Each vertically extending signal via may have a lower end in contact with a respective transducer electrode. The interface board may have laterally extending signal traces carried by the dielectric layer. Each laterally extending signal trace may be in contact with an upper end of a respective vertically extending signal via.

24 Claims, 8 Drawing Sheets

(52) U.S. Cl.
CPC ............... *H05K 2201/0707* (2013.01); *H05K 2201/09227* (2013.01); *H05K 2201/10121* (2013.01)

(58) Field of Classification Search
CPC . H05K 2201/10454; H05K 2201/0707; H05K 2201/09227
See application file for complete search history.

(56) References Cited

U.S. PATENT DOCUMENTS

| | | | |
|---|---|---|---|
| 5,477,087 A | 12/1995 | Kawakita et al. | |
| 5,841,913 A * | 11/1998 | Marcuse | G02F 1/125 385/28 |
| 5,879,787 A * | 3/1999 | Petefish | H05K 3/421 428/209 |
| 5,923,460 A | 7/1999 | Stewart et al. | |
| 6,320,989 B1 | 11/2001 | Montgomery et al. | |
| 6,487,324 B2 | 11/2002 | Montgomery et al. | |
| 6,538,690 B1 | 3/2003 | Montgomery et al. | |
| 6,765,709 B1 | 7/2004 | Montgomery et al. | |
| 6,870,658 B2 | 3/2005 | Wasilousky et al. | |
| 6,891,266 B2 | 5/2005 | Kinayman et al. | |
| 7,113,289 B1 * | 9/2006 | Beary | G01S 7/497 356/622 |
| 7,538,929 B2 | 5/2009 | Wasilousky | |
| 7,816,721 B2 * | 10/2010 | Yamazaki | G11C 13/0004 438/210 |
| 8,981,568 B2 | 3/2015 | Rathbur | |
| 2002/0195496 A1 * | 12/2002 | Tsikos | B82Y 15/00 235/462.01 |
| 2003/0178395 A1 * | 9/2003 | Duignan | C23C 14/048 219/121.61 |
| 2006/0116000 A1 * | 6/2006 | Yamamoto | H05K 3/0011 257/E21.585 |
| 2008/0100504 A1 * | 5/2008 | Martin | H01Q 3/22 342/197 |
| 2008/0128506 A1 * | 6/2008 | Tsikos | G06K 7/10732 235/462.42 |
| 2008/0247027 A1 * | 10/2008 | Wasilousky | G02F 1/113 359/286 |
| 2018/0203325 A1 | 7/2018 | Wasilousky et al. | |

OTHER PUBLICATIONS

LCL Panametrics "1976 IEEE Ultrasonics Symposium Abstracts" IEEE Transactions on Sonics and Ultrasonics: https://ieeexplore.ieee.org/iel5/10326/32824/01538998.pdf; Mar. 1977; pp. 32.
U.S. Appl. No. 16/458,457, filed Jul. 1, 2019 Lange et al.

* cited by examiner

AOM SYSTEM WITH INTERFACE BOARD AND SIGNAL VIAS AND RELATED METHODS

TECHNICAL FIELD

The present invention relates to the field of optical devices, and, more particularly, to AOMs for lasers and related methods.

BACKGROUND

Acousto-optic modulators (AOMs), sometimes referred to as Bragg cells, diffract and shift light using sound waves at radio frequency. These devices are often used for Q-switching, signal modulation in telecommunications systems, laser scanning and beam intensity control, frequency shifting, and wavelength filtering in spectroscopy systems. Many other applications lend themselves to using acousto-optic devices.

In such acousto-optic devices, a piezoelectric transducer, sometimes also referred to as a radio frequency (RF) transducer, is secured to an acousto-optic bulk medium as a transparent optical material, for example, fused silica, quartz or similar glass material. An electric RF signal oscillates and drives the transducer to vibrate and create sound waves within the transparent medium, which effect the properties of an optical field in the medium via the photo elastic effect, in which a modulating strain field of an ultrasonic wave is coupled to an index of refraction for the acousto-optic bulk medium. As a result, the refractive index change in amplitude is proportional to that of sound.

The index of refraction is changed by moving periodic planes of expansion and compression in the acousto-optic bulk material. Incoming light scatters because of the resulting periodic index modulation and interference, similar to Bragg diffraction.

AOMs are preferred in many applications because they are faster than tilt-able mirrors and other mechanical devices. The time it takes for the acousto-optic modulator to shift an exiting optical beam is limited to the transit time of the sound wave. The AOMs are often used in Q-switches where a laser produces a pulsed output beam at high peak power, typically in the Kilowatt range. This output could be higher than lasers operating a continuous wave (CW) or constant output mode.

Examples of acousto-optic modulator devices and similar acousto-optic systems are disclosed in commonly assigned U.S. Pat. Nos. 4,256,362; 5,923,460; 6,320,989; 6,487,324; 6,538,690; 6,765,709; and 6,870,658, the disclosures of which are hereby incorporated by reference in their entireties.

One approach which may be used to help enhance the diffracted beam pointing stability of acousto-optic devices is set forth in U.S. Pat. No. 7,538,929 to Wasilousky, which is assigned to the Harris Corporation and is hereby incorporated herein in its entirety by reference. Wasilousky discloses an acousto-optic modulator, which includes an acousto-optic bulk medium and transducer attached to the acousto-optic bulk medium and formed as a linear array of electrodes.

SUMMARY

Generally, a system may include a laser source, and an AOM coupled to the laser source. The AOM may include an acousto-optic medium, and a plurality of transducer electrodes carried by the acousto-optic medium. The system may also include an interface board comprising a dielectric layer, and a plurality of vertically extending signal vias within the dielectric layer. Each vertically extending signal via may have a lower end in contact with a respective transducer electrode. The interface board may comprise a plurality of laterally extending signal traces carried by the dielectric layer. Each laterally extending signal trace may be in contact with an upper end of a respective vertically extending signal via.

In many embodiments, the AOM may include a reference voltage contact pad carried by the acousto-optic medium. The interface board may comprise a plurality of vertically extending shield vias within the dielectric layer coupled to the reference voltage contact pad and defining respective reference voltage shields between adjacent laterally extending signal traces. The plurality of vertically extending shield vias also may define respective reference voltage shields for distal ends of the plurality of transducer electrodes. The plurality of vertically extending shield vias may be coupled to a reference voltage on the interface board.

Also, the system may include modulator drive circuitry coupled to the plurality of laterally extending signal traces. The plurality of transducer electrodes may comprise first and second sets of transducer electrodes. The plurality of vertically extending signal vias may comprise first and second sets of vertically extending signal vias in contact with respective ones of the first and second sets of transducer electrodes on opposite sides of the acousto-optic medium.

Additionally, the acousto-optic medium may have a plurality of trenches therein. Each trench may be between adjacent ones of the plurality of transducer electrodes. The acousto-optic medium may comprise at least one of fused silica and quartz, for example. The system may include an atom trap downstream from the AOM so that the system defines a quantum computer.

Another aspect is directed to an interface board for a system comprising a laser source, and an AOM coupled to the laser source and comprising an acousto-optic medium, and a plurality of transducer electrodes carried by the acousto-optic medium. The interface board may include a dielectric layer, and a plurality of vertically extending signal vias within the dielectric layer. Each vertically extending signal via may have a lower end in contact with a respective transducer electrode. The interface board may comprise a plurality of laterally extending signal traces carried by the dielectric layer. Each laterally extending signal trace may be in contact with an upper end of a respective vertically extending signal via.

Yet another aspect is directed to a method of making a system. The method may include forming an interface board comprising a dielectric layer, and a plurality of vertically extending signal vias within the dielectric layer. Each vertically extending signal via may have a lower end in contact with a respective transducer electrode carried by an acousto-optic medium of an acousto-optic modulator (AOM). The interface board may comprise a plurality of laterally extending signal traces carried by the dielectric layer. Each laterally extending signal trace may be in contact with an upper end of a respective vertically extending signal via. The method may further comprise coupling the interface board to the AOM.

DETAILED DESCRIPTION OF THE EMBODIMENTS

Figure 1:
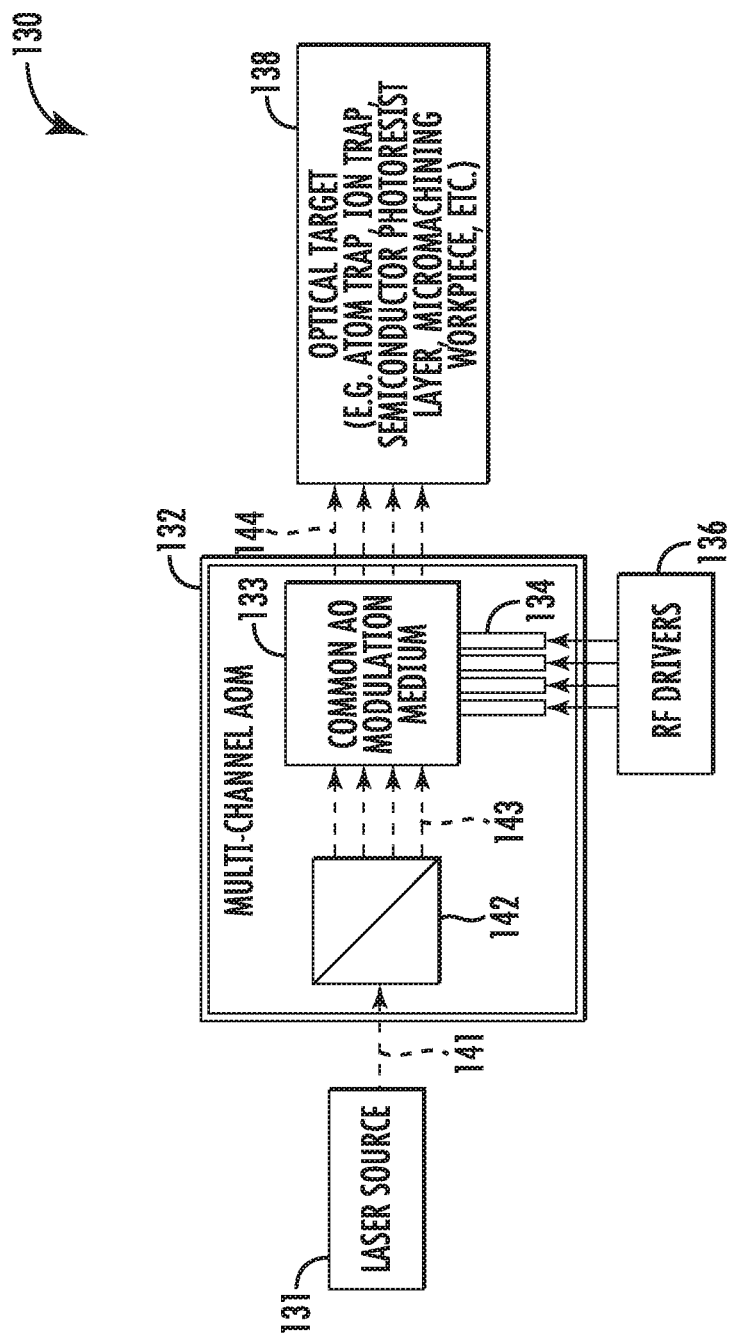
FIG. 1 is a schematic block diagram of a system including a multi-channel AOM in accordance with a first example embodiment, according to the present disclosure.

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and base 100 reference numerals are used to indicate similar elements in alternative embodiments.

By way of background, excessive noise levels from laser sources in optical illumination systems may generate instabilities and errors. In particular, systems that manipulate the quantum states of particles, atoms and electrons, may require extreme stability.

Inter-channel acoustic crosstalk is a major source of data dependent variation in the modulated optical beam intensity. Electrical crosstalk between input channels can interfere coherently to produce variations in corresponding channel first order optical levels. In addition to coherent interactions leading to "ON" crosstalk effects on the optical beams, electrical crosstalk from other channels may induce a signal on a channel that is not being actively driven. This results in the production of a weak secondary "OFF" optical beam in the associated channel. Both the occurrence of "ON" and "OFF" channel crosstalk effects on the optical levels in the respective channels constitute a corrupting factor in many applications, such as, laser photomask generation and ion array based quantum computing.

In typical approaches, the connection of the electrical drive signals to the individual transducers may rely on the use of bond wires between an interface card terminating pad and associated transducer electrode. These bond wires may act as a source of magnetic field coupling between channels, primarily those whose feeds lie adjacent to one another. Additionally, electric field capacitive coupling between adjacent electrodes may produce undesirable crosstalk in localized channels as well.

Figure 2:
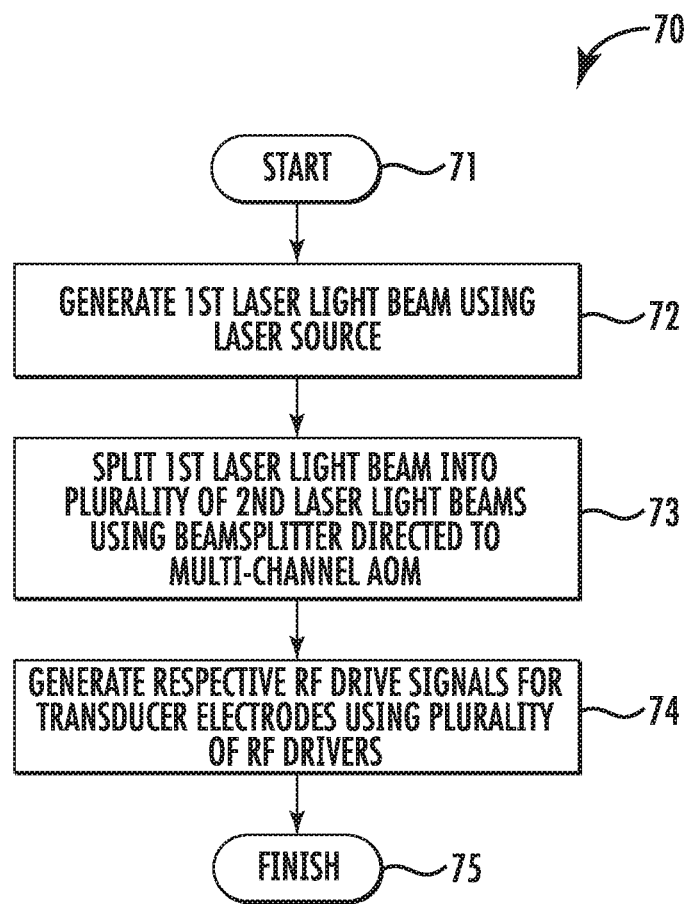
FIG. 2 is a flowchart illustrating method aspects associated with the system of FIG. 1.

Referring initially to FIG. 1 and a flowchart 70 of FIG. 2, a laser system 130, which provides multi-channel operation, and associated method aspects are now described. Beginning at Block 71, the multi-channel system 130 illustratively includes a laser source 131, which generates a first laser light beam 141, at Block 72. A diffractive/refractive beam splitter 142 divides the first laser light beam 141 into a plurality of second laser light beams 143, at Block 73, which in the illustrated example is four, although other numbers of beams (e.g., 8, 32, etc.) may be used depending upon the given application.

The second laser light beams 143 are received by a common acousto-optic modulation medium 133 of a multi-channel AOM 132. In other words, the acousto-optic medium 133 is common to all of the second laser light beams 143 (i.e. the same acousto-optic medium is used to modulate each of the second laser light beams into modulated laser light beams 144). However, it should be noted that a phase-capable multi-channel AOM 132 need not be used, and that an amplitude modulation AOM may instead by used, for example.

The AOM 132 further includes multiple transducers, each comprising respective electrodes 134, for each of the second laser light beams 143 coupled to the common acousto-optic medium 133. The laser system 130 further illustratively includes a plurality of RF drivers 136, each configured to generate a requisite RF drive signals for their respective transducer electrodes 134, at Block 74, which illustratively concludes the method of FIG. 2 (Block 75).

Each RF driver 136 may be configured to drive a transducer comprising a single element or a transducer comprising an array of transducer elements 134 with different phases. By way of example, the transducer electrodes 134 may be implemented as metallizations on the piezoelectric AO medium 133, which are spaced apart 500 µm or less at their centers, and more particularly 450 µm or less. However, other dimensions may be used in different embodiments.

Accordingly, employing a phase modulation capable AOM or transducer structure in a multi-channel device configuration may provide advantages. More particularly, the effects of inter-channel acoustic crosstalk may be reduced since the integrated optical effect resulting from changes in the localized strain field due to adjacent transducer operation should be smaller than turning the adjacent field off altogether. This technique may be particularly appropriate when reduced "ON/OFF" contrast is acceptable, for example, mask generation involving photoresist. However, in addition to a photoresist layer of a semiconductor device, other optical targets 138 may also be used with the system 130, such as an ion trap(s), micromachining workpiece, etc.

Figure 3:
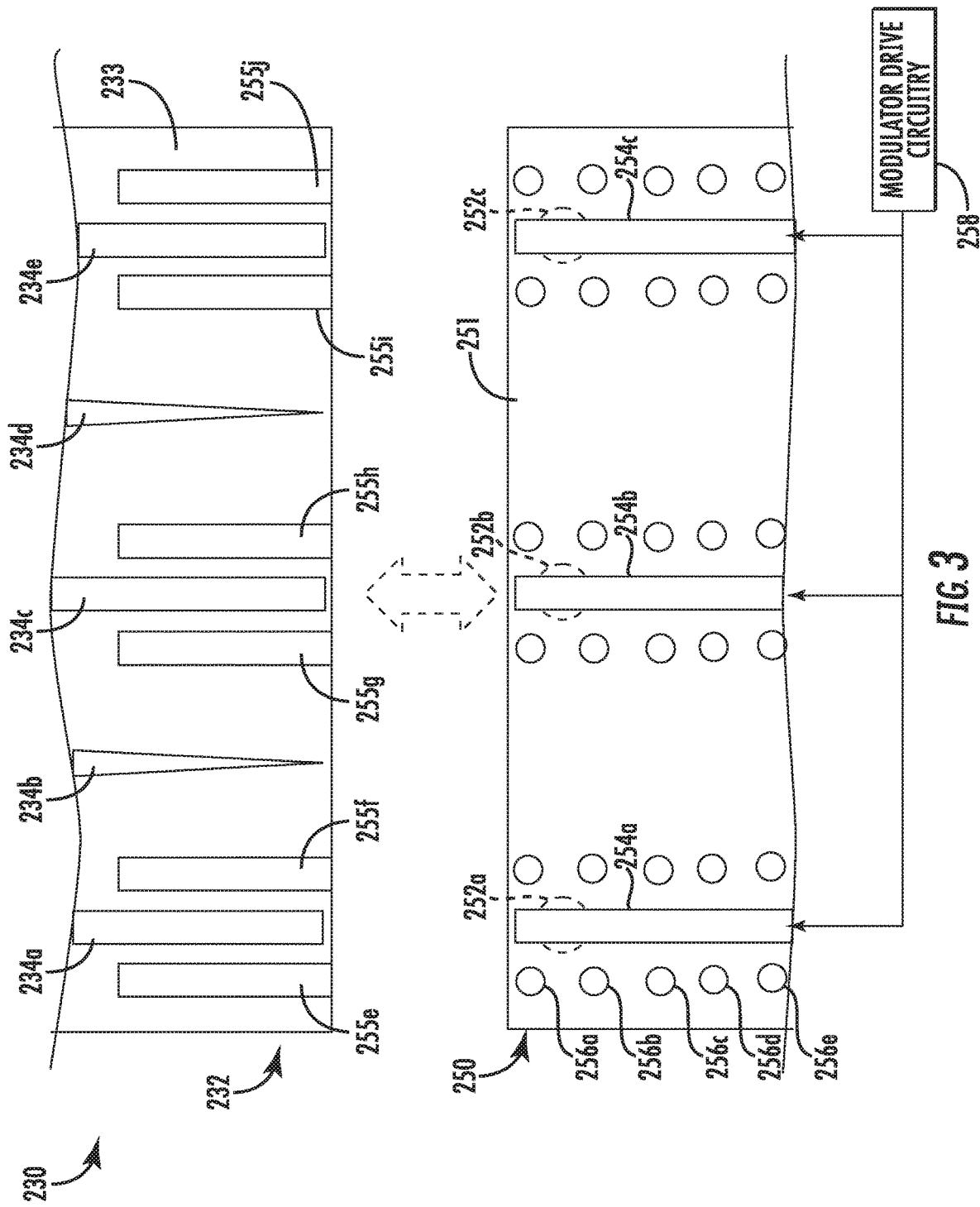
FIG. 3 is a schematic top plan view of an AOM and an interface card within a second example embodiment of the system, according to the present disclosure.
Figure 4:
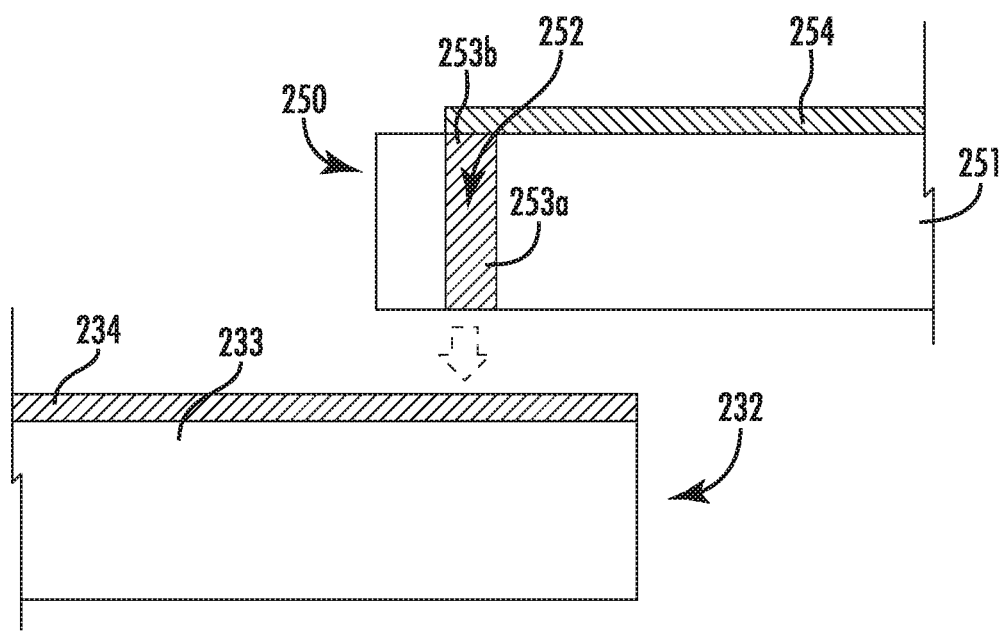
FIG. 4 is a schematic cross-sectional view of the AOM and the interface card of FIG. 3.
Figure 5:
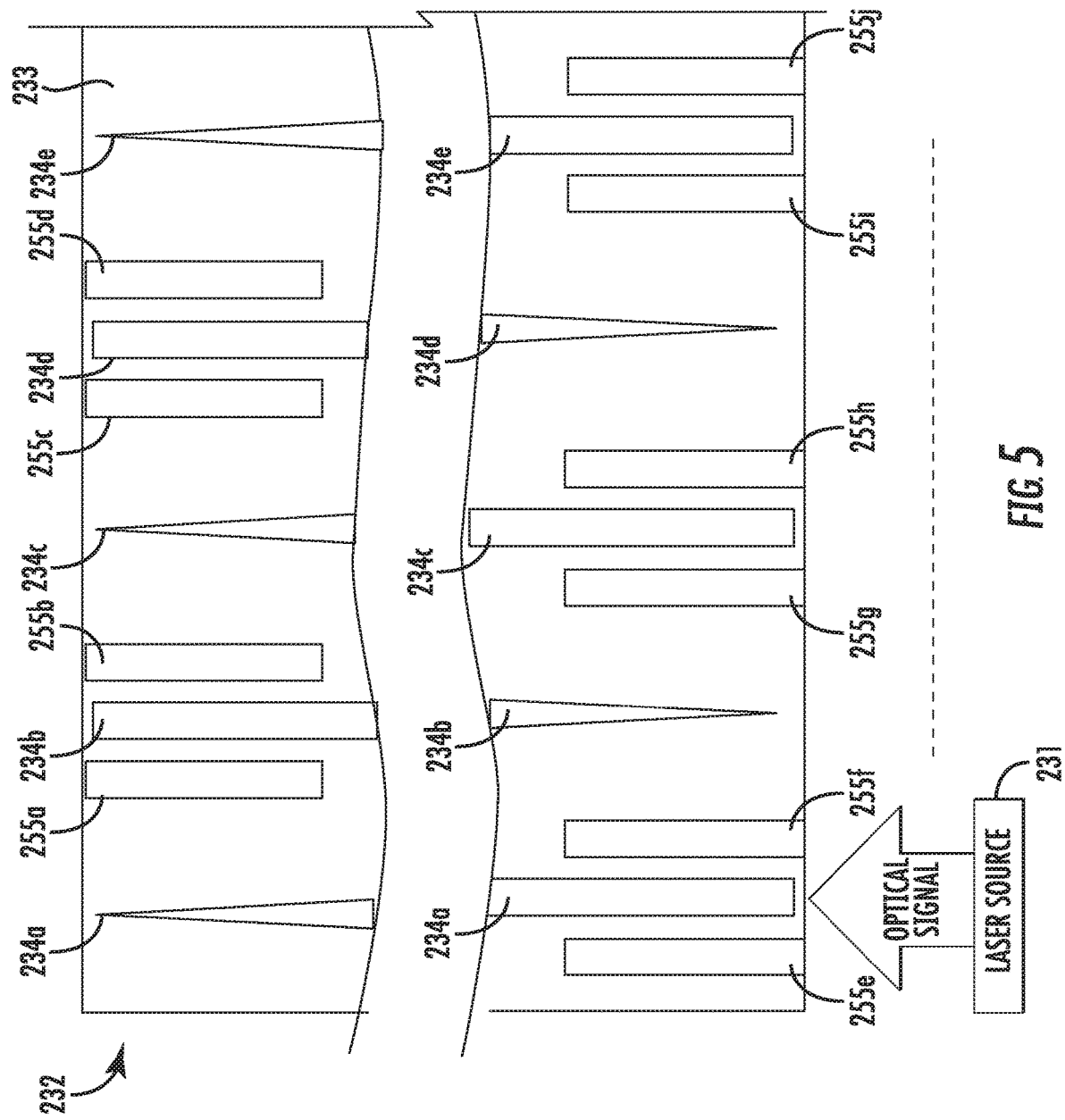
FIG. 5 is a schematic top plan view of the AOM of FIG. 3.

Referring now to FIGS. 3-5, another system 230 according to the present disclosure is now described. The system 230 illustratively comprises a laser source 231 (e.g. CW or pulsed laser source), and an AOM 232 coupled to the laser source. The AOM 232 may comprise a multi-channel AOM, such as in the embodiment of FIGS. 1-2, or a single channel AOM.

The AOM 232 illustratively includes an acousto-optic medium 233, and a plurality of transducer electrodes 234a-234e carried by the acousto-optic medium. The acousto-optic medium 233 may comprise at least one of fused silica and quartz, for example. In some embodiments, the system 230 may include an atom trap (FIG. 1) downstream from the AOM 232 so that the system defines a quantum computer.

The system 230 illustratively comprises an interface board 250 comprising a dielectric layer 251, and a plurality of vertically extending signal vias 252a-252c within the dielectric layer. As perhaps best seen in FIG. 4, each vertically extending signal via 252a-252c has a lower end 253a in contact with a respective transducer electrode 234. As will be appreciated, the lower end 253a of the plurality of vertically extending signal vias 252a-252c may be coupled to respective ones of the plurality of transducer electrodes 234a-234e using a board to board coupling technique, such as a conductive adhesive bonding method, or a pressure based contact method.

The interface board 250 illustratively comprises a plurality of laterally extending signal traces 254a-254c carried by the dielectric layer 251. Each laterally extending signal trace 254a-254c is in contact with an upper end 253b of a respective vertically extending signal via 252a-252c. In the illustrated embodiment, the plurality of laterally extending signal traces 254a-254c is carried on an upper surface of the dielectric layer 251, but in other embodiments, the plurality of laterally extending signal traces may extend within internal portions of the dielectric layer, or perhaps on the lower surface of the dielectric layer.

Also, the system 230 illustratively comprises modulator drive circuitry 258 coupled to the plurality of laterally extending signal traces 254a-25c. As will be appreciated, the modulator drive circuitry 258 is configured to generate a plurality of RF signals for respectively driving the plurality of transducer electrodes 234a-234e.

The AOM 232 includes a reference voltage contact pad (i.e. a ground voltage contact pad) 255a-255j carried by the acousto-optic medium 233 and adjacent to each of the plurality of transducer electrodes 234a-234e at their signal trace connection point. The interface board 250 illustratively comprises a plurality of vertically extending shield vias 256a-256e within the dielectric layer 251 coupled to the reference voltage contact pad 255a-255j and defining respective ground or reference voltage shields between adjacent laterally extending signal traces 254a-254c. As will be appreciated, the reference voltage contact pads 255a-255j may be coupled to an electrode reference voltage/ground at the bond interface of the AOM 232. As perhaps best seen in FIG. 3, each of the laterally extending signal traces 254a-254c is flanked on both sides with a row of vertically extending shield vias 256a-256e. Since these vertically extending shield vias 256a-256e are connected to the respective reference voltage contact pads 255a-255j, they provide for reduction in the inter-channel crosstalk.

The plurality of vertically extending shield vias 256a-256e also defines respective ground/reference voltage shields for distal ends of the plurality of transducer electrodes 234a-234e. More specifically, when the interface board 250 is coupled to a side of the AOM 232, the plurality of vertically extending shield vias 256a-256e overlays and is aligned with the reference voltage contact pads 255a-255j. The plurality of vertically extending shield vias 256a-256e is additionally coupled to a common signal generator ground reference voltage on the interface board 250. For example, the reference voltage on the interface board 250 may comprise a ground potential.

As perhaps best seen in FIG. 5, the plurality of transducer electrodes 234a-234e comprises a first set of transducer electrodes 234a, 234c, 234e and a second set of transducer electrodes 234b, 234d interdigitated with the first set of transducer electrodes. The plurality of vertically extending signal vias 252a-252c comprises first and second sets of vertically extending signal vias in contact with respective ones of the first and second sets of interdigitated transducer electrodes 234a-234e on opposite sides of the AOM 232.

In particular, as perhaps best seen in FIG. 4, the interface board 250 is coupled to the opposite sides of the AOM 232. For example, in some embodiments, the interface board 250 would comprise first and second interface boards for coupling to the opposite sides of the AOM 232.

Yet another aspect is directed to a method of making a system 230. The method comprises forming an interface board 250 comprising a dielectric layer 251, and a plurality of vertically extending signal vias 252a-252c within the dielectric layer. Each vertically extending signal via 252a-252o has a lower end 253a in contact with a respective transducer electrode 234a-234e at the top surface of a piezoelectric platelet bonded to an acousto-optic medium 233 of an AOM 232. The interface board 250 illustratively comprises a plurality of laterally extending signal traces 254a-254c carried by the dielectric layer 251. Each laterally extending signal trace 254a-254c is in contact with an upper end 253b of a respective vertically extending signal via 252a-252c. The method includes coupling the interface board 250 to the AOM 232.

Figure 6:
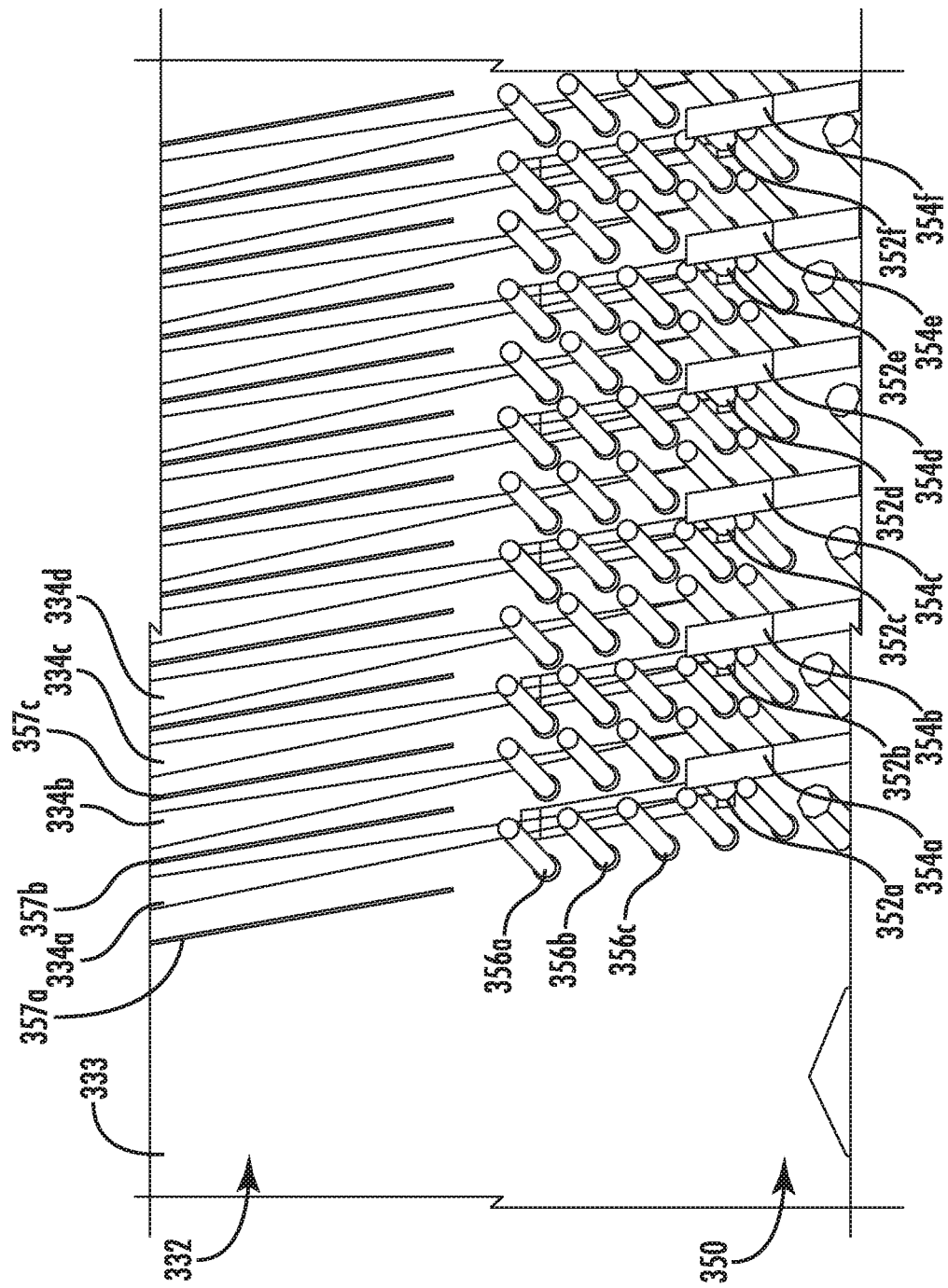
FIG. 6 is a schematic perspective view of a third example embodiment of the AOM and the interface card with the dielectric layer cutaway for clarity of explanation, according to the present disclosure.

Referring now additionally to FIG. 6, another embodiment of the AOM 332 and the interface board 350 is now described. In this embodiment of the AOM 332, and the interface board 350 containing the signal traces and associated shield vias, those elements already discussed above with respect to FIGS. 3-5 are incremented by 300 and most require no further discussion herein. This embodiment differs from the previous embodiment in that this AOM 332 illustratively includes an acousto-optic medium 333 having a plurality of trenches 357a-357c produced by removal of the high dielectric constant piezoelectric transducer platelet material between individual electrodes 334a-334c therein. Each trench 357a-357c is between adjacent ones of the plurality of transducer electrodes 334a-334c.

Figure 7:
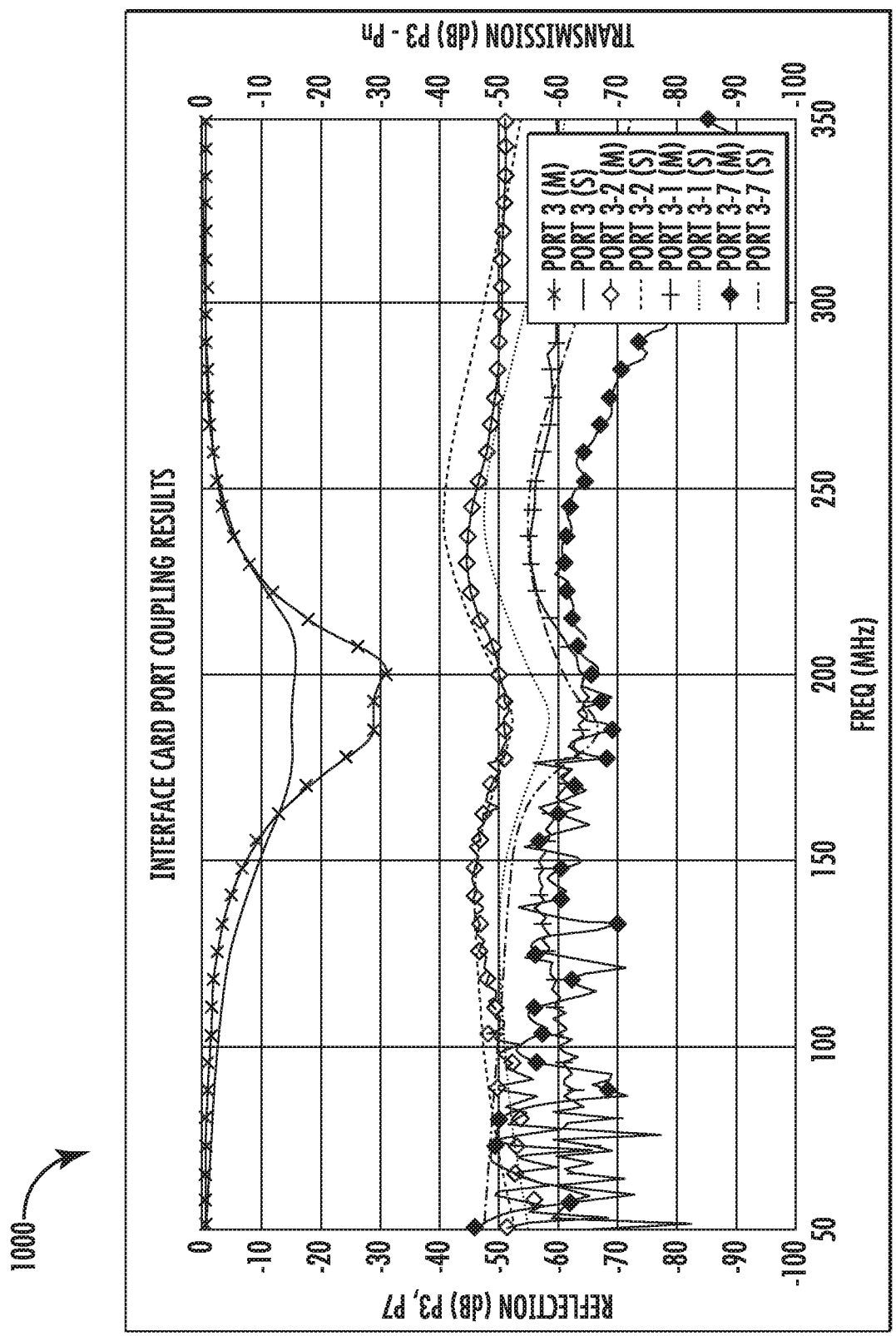
FIGS. 7 and 8 are diagrams of interface card port coupling in the AOM and the interface card, according to the present disclosure.
Figure 8:
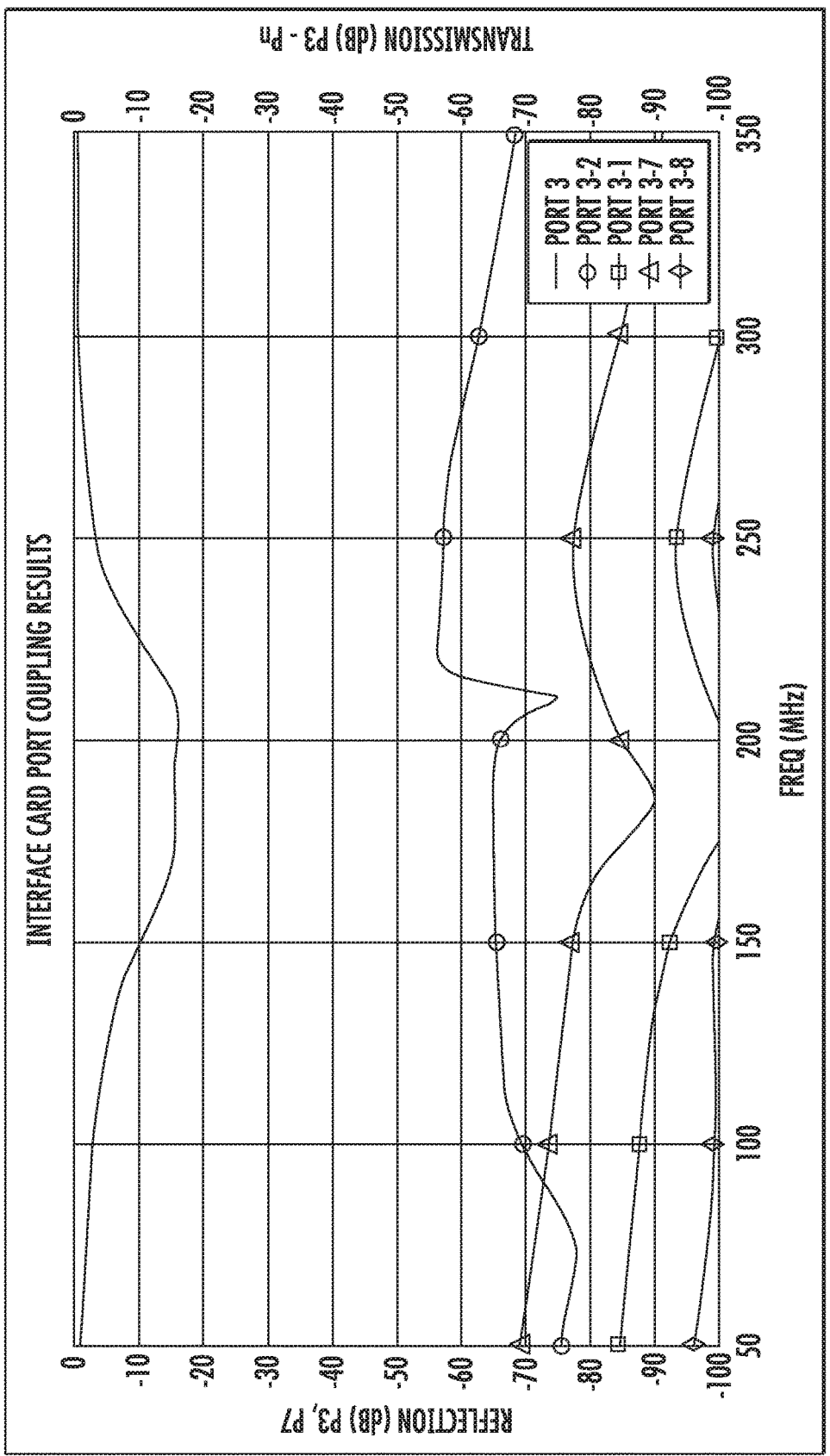

Referring now additionally to FIGS. 7-8, diagrams 1000, 1020 show a reduction in cross-talk between input channels in the system 230 disclosed herein. Applicant has determined that crosstalk between inputs originating on the same side of the interface card "electrical neighbors" may be a significant contributor to channel optical crosstalk. In addition, this source of crosstalk can severely limit the utility of using local channel active cancellation schemes to reduce optical crosstalk levels in an "off" channel resulting from acoustic spillover from nearest neighbor channels "optical neighbors". This technique relies on insertion of a low level "cancellation" signal within the primary acoustic channel having the correct amplitude and phase to reduce the integrated optical effect applied to the input beam in that channel. A high degree of electrical isolation may be required to minimize corruption of the low level cancellation input signal.

Applicant performed a detailed analysis of the input RF feed assembly associated with typical AOM construction to determine the principle factors contributing to the observed levels of electrical crosstalk. Diagram 1000 shows the measured and simulated model electrical port transmission coupling levels obtained for the typical monolithic multichannel AOM.

Review of the model results indicates the principal contributor to adjacent electrical neighbor coupling comes from the bond wires connecting the input RF interface card terminating pads to the respective transducer electrodes. The levels of crosstalk produced by this source of coupling between input channels can interfere coherently with other "ON" channels to produce variations in the optical illumination levels presented to the individual ions. Depending on the relative drive signal phase offset, this can result in a variation in channel beam intensity of greater than +/−0.6% for an RF coupling level of −50 dB between adjacent channels. With many channels driven at the same time, the variation in intensity observed within any one channel may readily exceed +/−1.0%.

In addition to coherent interactions leading to "ON" crosstalk effects on the optical beams, electrical crosstalk from other channels and acoustic diffraction "spillover" from adjacent channels, may induce a signal on a channel which is not being actively driven. This results in the production of a weak secondary "OFF" optical beam in the associated channel. In ion trap array qubit addressing applications, this low level coherent optical field may appear as a low level addressable Raman beam. The presence of a corrupting optical field at an un-addressed ion location may directly contribute to internal ionic state errors and decoherence of the ion array, leading to a measured reduction in gate fidelity. Both the occurrence of "ON" and "OFF" channel crosstalk effects on the optical levels in the respective channels constitute a corrupting factor in many applications, such as laser photomask generation and ion array based quantum computing.

As shown in diagram 1020, the results obtained indicate a carefully structured interface (e.g., the above system 230), which eliminates the use of conventional bond wire connections while incorporating several additional modifications to both the interface card and the resonant platelet structure, may significantly reduce electrical coupling between ports.

In summary, the system 230 eliminates conventional bond wire connections between the transducer electrode and corresponding trace pad. The system 230 may provide a direct connection of the trace input termination pad directly to the transducer electrode. By using the shield via structure connecting to the interface board 250 ground to the transducer ground plane adjacent to the signal pad connection point, the system 230 may reduce channel crosstalk. Moreover, the system 230 removes high dielectric transducer "trench" region between adjacent electrodes to reduce inter-electrode coupling capacitance.

Other features relating to optics are disclosed in co-pending application, titled "Multi-Channel Laser System Including An AOM With Beam Polarization Switching And Related Methods," U.S. patent application Ser. No. 16/458,457, which is incorporated herein by reference in its entirety.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:

1. A system comprising:
   a laser source;
   an acousto-optic modulator (AOM) coupled to said laser source and comprising an acousto-optic medium, and a plurality of transducer electrodes carried by said acousto-optic medium; and
   an interface board comprising
      a dielectric layer,
      a plurality of vertically extending signal vias within said dielectric layer, each vertically extending signal via having a lower end in contact with a respective transducer electrode, and
      a plurality of laterally extending signal traces carried by said dielectric layer, each laterally extending signal trace in contact with an upper end of a respective vertically extending signal via.

2. The system of claim 1 wherein said AOM comprises a reference voltage contact pad carried by said acousto-optic medium; and wherein said interface board comprises a plurality of vertically extending shield vias within said dielectric layer coupled to said reference voltage contact pad and defining respective reference voltage shields between adjacent laterally extending signal traces.

3. The system of claim 2 wherein said plurality of vertically extending shield vias also defines respective reference voltage shields for distal ends of said plurality of transducer electrodes.

4. The system of claim 2 wherein said plurality of vertically extending shield vias is coupled to a reference voltage on said interface board.

5. The system of claim 1 comprising modulator drive circuitry coupled to said plurality of laterally extending signal traces.

6. The system of claim 1 wherein said plurality of transducer electrodes comprises first and second sets of transducer electrodes.

7. The system of claim 6 wherein said plurality of vertically extending signal vias comprises first and second sets of vertically extending signal vias in contact with respective ones of said first and second sets of transducer electrodes on opposite sides of said acousto-optic medium.

8. The system of claim 1 wherein said acousto-optic medium has a plurality of trenches therein, each trench between adjacent ones of said plurality of transducer electrodes.

9. The system of claim 1 wherein said acousto-optic medium comprises at least one of fused silica and quartz.

10. The system of claim 1 comprising an atom trap downstream from said AOM so that the system defines a quantum computer.

11. A system comprising:
    a laser source;
    an acousto-optic modulator (AOM) coupled to said laser source and comprising an acousto-optic medium, a plurality of transducer electrodes carried by said acousto-optic medium, and a reference voltage contact pad carried by said acousto-optic medium;
    an interface board comprising
       a dielectric layer,
       a plurality of vertically extending signal vias within said dielectric layer, each vertically extending signal via having a lower end in contact with a respective transducer electrode,
       a plurality of laterally extending signal traces carried by said dielectric layer, each laterally extending signal trace in contact with an upper end of a respective vertically extending signal via, and
       a plurality of vertically extending shield vias within said dielectric layer coupled to said reference voltage contact pad and defining respective reference voltage shields between adjacent laterally extending signal traces; and
    modulator drive circuitry coupled to said plurality of laterally extending signal traces.

12. The system of claim 11 wherein said plurality of vertically extending shield vias also defines respective reference voltage shields for distal ends of said plurality of transducer electrodes.

13. The system of claim 11 wherein said plurality of vertically extending shield vias is coupled to a reference voltage on said interface board.

14. The system of claim 11 wherein said plurality of transducer electrodes comprises first and second sets of transducer electrodes.

15. The system of claim 14 wherein said plurality of vertically extending signal vias comprises first and second sets of vertically extending signal vias in contact with respective ones of said first and second sets of transducer electrodes on opposite sides of said acousto-optic medium.

16. The system of claim 11 wherein said acousto-optic medium has a plurality of trenches therein, each trench between adjacent ones of said plurality of transducer electrodes.

17. An interface board for a system comprising a laser source, and an acousto-optic modulator (AOM) coupled to the laser source and comprising an acousto-optic medium, and a plurality of transducer electrodes carried by the acousto-optic medium, the interface board comprising:
   a dielectric layer;
   a plurality of vertically extending signal vias within said dielectric layer, each vertically extending signal via having a lower end in contact with a respective transducer electrode; and
   a plurality of laterally extending signal traces carried by said dielectric layer, each laterally extending signal trace in contact with an upper end of a respective vertically extending signal via.

18. The interface board of claim 17 further comprising a plurality of vertically extending shield vias within said dielectric layer coupled to a reference voltage contact pad of the AOM and defining respective reference voltage shields between adjacent laterally extending signal traces.

19. The interface board of claim 18 wherein said plurality of vertically extending shield vias also defines respective reference voltage shields for distal ends of said plurality of transducer electrodes.

20. The interface board of claim 18 wherein said plurality of vertically extending shield vias is coupled to a reference voltage of the interface board.

21. A method of making a system comprising:
   forming an interface board comprising
      a dielectric layer,
      a plurality of vertically extending signal vias within the dielectric layer, each vertically extending signal via having a lower end in contact with a respective transducer electrode carried by an acousto-optic medium of an acousto-optic modulator (AOM), and
      a plurality of laterally extending signal traces carried by the dielectric layer, each laterally extending signal trace in contact with an upper end of a respective vertically extending signal via; and
   coupling the interface board to the AOM.

22. The method of claim 21 wherein the AOM comprises a reference voltage contact pad carried by the acousto-optic medium; and wherein the interface board comprises a plurality of vertically extending shield vias within the dielectric layer coupled to the reference voltage contact pad and defining respective reference voltage shields between adjacent laterally extending signal traces.

23. The method of claim 22 wherein the plurality of vertically extending shield vias also defines respective reference voltage shields for distal ends of a plurality of transducer electrodes.

24. The method of claim 22 wherein the plurality of vertically extending shield vias is coupled to a reference voltage on the interface board.

* * * * *